United States Patent
Tada

[11] Patent Number: 5,994,980
[45] Date of Patent: Nov. 30, 1999

[54] ELASTIC SURFACE ACOUSTIC WAVE FILTER DEVICE WITH BALANCED AND UNBALANCED INPUT/OUTPUT TERMINALS

[75] Inventor: Yutaka Tada, Kanazawa, Japan

[73] Assignee: Murata Manufacturing Co., Ltd., Japan

[21] Appl. No.: 08/946,265

[22] Filed: Oct. 7, 1997

[30] Foreign Application Priority Data

Oct. 9, 1996 [JP] Japan ................................. 8-268397

[51] Int. Cl.⁶ .................................................. H03H 9/64
[52] U.S. Cl. ....................................... 333/193; 310/313 R
[58] Field of Search .................................. 333/193–196, 333/25; 310/313 R, 313 B, 313 C, 313 D

[56] References Cited

U.S. PATENT DOCUMENTS

| | | | |
|---|---|---|---|
| 5,475,348 | 12/1995 | Hode et al. | 333/194 X |
| 5,568,002 | 10/1996 | Kawakatsu et al. | 333/193 X |
| 5,581,141 | 12/1996 | Yamada et al. | 333/195 X |
| 5,790,000 | 8/1998 | Dai et al. | 333/193 |

*Primary Examiner*—Robert Pascal
*Assistant Examiner*—Barbara Summons
*Attorney, Agent, or Firm*—Joseph R. Keating, Esq.; Graham & James LLP

[57] ABSTRACT

An elastic surface acoustic wave filter device provides balanced operation with a neutral terminal kept at a ground potential and is adaptable for any system of unbalanced input-to-balanced output or balanced input-to-unbalanced output even with an input and an output having a different characteristic impedance. A first elastic surface acoustic wave filter having a first predetermined phase is connected in a cascade arrangement to a second elastic surface acoustic wave filter having a phase that is different by about 180 degrees from the first predetermined phase to form a first set of cascaded elastic surface acoustic wave filters. A third elastic surface acoustic wave filter having the first predetermined phase is connected in a cascade arrangement to a fourth elastic surface acoustic wave filter having the predetermined phase to form a second set of cascaded elastic surface acoustic wave filters. One of input/output terminals of the first set of cascaded elastic surface acoustic wave filters and one of input/output terminals of the second set of cascaded elastic surface acoustic wave filters are electrically connected in parallel to an unbalanced input/output terminal. The other of input/output terminals of the first set of cascaded elastic surface acoustic wave filters and the other of input/output terminals of the second set of cascaded elastic surface acoustic wave filters are electrically connected in series to balanced input/output terminals.

9 Claims, 13 Drawing Sheets

ELASTIC SURFACE ACOUSTIC WAVE FILTER DEVICE WITH BALANCED AND UNBALANCED INPUT/OUTPUT TERMINALS

BACKGROUND OF THE INVENTION

1. Field of the Invention

The present invention relates to an elastic surface acoustic wave filter device.

2. Description of the Related Art

Recently, with mobile body terminals becoming smaller and less expensive, it has become desirable to reduce the number of parts in mobile body terminals and to combine several parts into an integral composite unit in the circuit configuration. Recent elastic surface acoustic wave filter devices have succeeded in reducing insertion loss and have begun to be provided in antenna top units as well.

FIG. 17 shows one example of an elastic surface acoustic wave filter device used in mobile body terminals, taking the reception side (RX) as an example. Generally, an RF signal is input from an antenna (ANT) through a switch (SW) to an elastic surface acoustic wave filter device (SAW) with unbalanced terminals and a characteristic impedance of 50 Ω. On the other hand, an amplifier (LNA) is an operational amplifier and has balanced terminals in many cases. This means that the amplifier requires a characteristic impedance of about 150–200 Ω to receive an input if unbalanced terminals are used. However, most elastic surface acoustic wave filter devices (SAW) usually have an input/output impedance of 50 Ω within the SAW device and unbalanced input/output terminals. For this reason, although elastic surface acoustic wave filter devices can be directly connected to the antenna (ANT) side, a matching circuit for impedance conversion and an unbalanced-to-balanced transformer have been required for connection to the amplifier (LNA) side. A balun circuit (hereinafter referred to simply as a balun) has been used for that function, but the use of a balun has increased the number of parts and cost. There has been thus a demand for eliminating the use of a matching circuit and an unbalanced-to-balanced transformer.

Recently, a variety of studies have been made to satisfy the above demand. Japanese Unexamined Patent Publication No. 7-288442, for example, achieves a filter of balanced input-to-balanced output type by connecting elastic surface acoustic wave resonators in a symmetrical grid pattern.

FIG. 18 shows the construction of an elastic surface acoustic wave filter device disclosed in the above-cited Japanese Unexamined Patent Publication No. 7-288442. As shown in FIG. 18, an elastic surface acoustic wave filter device 100 comprises two serial arm resonators 101, 101 and two parallel arm resonators 102, 102. Input terminals of one serial arm resonator 101 and one parallel arm resonator 102 are connected to an input terminal 105, and input terminals of the other serial arm resonator 101 and the other parallel arm resonator 102 are connected to an input terminal 106.

Output terminals of one serial arm resonator 101 and the other parallel arm resonator 102 are connected to an output terminal 107, and output terminals of the other serial arm resonator 101 and one parallel arm resonator 102 are connected to an output terminal 108. Also, an inductor 109 is connected in series to each of the four resonators 101, 102.

The elastic surface acoustic wave filter device of balanced input-to-balanced output type is realized with the above construction. But the disclosed elastic surface acoustic wave filter device cannot be used, as it is, to a system having a unbalanced input-to-balanced output. As described in "A New Balanced to Unbalanced Type RF-Band SAW Filter", 1996 IEEE MTT-S Digest WE1A-5 (p 417–420) and Japanese Unexamined Patent Publication No. 8-65098, therefore, a filter of an unbalanced input-to-balanced output type is realized by connecting one of the input IDTs to a ground terminal and the output IDTs to the input terminals 105, 106 of the elastic surface acoustic wave filter device shown in FIG. 18.

Although a filter of unbalanced input-to-balanced output type can be realized according to the method of the above-cited Japanese Unexamined Patent Publication No. 8-65098, the elastic surface acoustic wave filter device still has a conventional characteristic impedance therein. Therefore, equal input and output impedance values such as 50 Ω—50 Ω, and a matching device for impedance matching is required for connection to the amplifier side having input impedance of about 150–200 Ω. Further, because the balanced output can be only realized in a floating type device, there arises a problem that a degree of balance outside the band is not complete and direct incoming waves cannot be sufficiently canceled out or suppressed.

An elastic surface acoustic wave filter device of a floating type experiences a problem in that the presence of a ground terminal in the filter input side affects an output terminal and a filter characteristic is varied from a desired value.

Additionally, to achieve connection to the amplifier side without a matching circuit, the impedance on the output side should not be equal to the impedance on the input side, but is required to be about 150–200 Ω, i.e., about three or four times as much as the input impedance. A problem of increasing mismatching loss would result if attempting to achieve such an unbalanced impedance construction is done only by improving a design of an elastic surface acoustic wave filter itself.

SUMMARY OF THE INVENTION

The preferred embodiments of the present invention overcome the above-mentioned both problems with matching of impedance and problems with incompleteness of balance experienced by conventional devices. To solve such problems, the preferred embodiments of the present invention provide an elastic surface acoustic wave filter device which achieves balanced operation with a neutral terminal kept at a ground potential, and which is adaptable for any system of unbalanced input-to-balanced output or balanced input-to-unbalanced output even with an input and an output having different impedance characteristics.

An elastic surface acoustic wave filter device according to a first preferred embodiment of the present invention comprises a first set of cascaded elastic surface acoustic wave filters including a first elastic surface acoustic wave filter having a first predetermined value of an input/output phase characteristic within a pass band of the elastic surface acoustic wave filter device connected in a cascade arrangement to a second elastic surface acoustic wave filter having an input/output phase characteristic difference of about 180 degrees from the first predetermined value of input/output phase characteristic within the pass band of the first elastic surface acoustic wave filter device, and a second set of cascaded elastic surface acoustic wave filters including a third elastic surface acoustic wave filter having a second predetermined value of input/output phase characteristic within a pass band of the elastic surface acoustic wave filter device connected in a cascade arrangement to a fourth elastic surface acoustic wave filter having the second predetermined value of input/output phase characteristic within the pass band of the elastic surface acoustic wave filter device, one of input/output terminals of the first set of cascaded elastic surface acoustic wave filters and one of input/output terminals of the second set of cascaded elastic surface acoustic wave filters being electrically connected in parallel to constitute an unbalanced input/output terminal, the other of input/output terminals of the first set of cascaded elastic surface acoustic wave filters and the other of input/output terminals of the second set of cascaded elastic surface acoustic wave filters being electrically connected in series to constitute balanced input/output terminals.

By cascading the elastic surface acoustic wave filters in multiple stages as described in the previous paragraph, the filter device can have a construction such that IDTs connected between the stages have no ground terminals, thus developing a buffer effect.

Further, since two elastic surface acoustic wave filters are connected in parallel on the input side and two elastic surface acoustic wave filters are connected in series on the output side with one of the two filters providing a reversed phase, output impedance is about four times as much as input impedance and a balanced output is obtained.

In an elastic surface acoustic wave filter device according to a preferred embodiment of the present invention, the balanced input/output terminals on the side where the first set of cascaded elastic surface acoustic wave filters and the second set of cascaded elastic surface acoustic wave filters are connected in series to each other serve as output terminals, and a serially connected junction of the output terminals serves as a ground terminal.

This feature makes it possible to achieve the balanced operation with a neutral potential provided by the ground potential.

In an elastic surface acoustic wave filter device according to another preferred embodiment, one of the elastic surface acoustic wave filters constituting the first set of cascaded elastic surface acoustic wave filters, which has an input/output characteristic that is different by about 180 degrees from the first predetermined value of input/output phase characteristic within the pass band, has an output IDT arranged in an opposite orientation relative to an input IDT of the other of the elastic surface acoustic wave filters constituting the first set of cascaded elastic surface acoustic wave filters which has the first predetermined value of input/output phase characteristic within the pass band, and also has an input IDT arranged in the same orientation as an output IDT of the other of the elastic surface acoustic wave filters constituting the first set of cascaded elastic surface acoustic wave filters which has the first predetermined value of input/output phase characteristic within the pass band.

In an elastic surface acoustic wave filter device according to another preferred embodiment, one of the elastic surface acoustic wave filters constituting the first set of cascaded elastic surface acoustic wave filters, which has an input/output characteristic which is different by about 180 degrees from the first predetermined value of input/output phase characteristic within the pass band, has an output IDT arranged in the same orientation as an input IDT of the other of the elastic surface acoustic wave filters constituting the first set of cascaded elastic surface acoustic wave filters which has the first predetermined value of input/output phase characteristic within the pass band, and also has an input IDT arranged in opposite orientation relative to an output IDT of the other of the elastic surface acoustic wave filters constituting the first set of cascaded elastic surface acoustic wave filters which has the first predetermined value of input/output phase characteristic within the pass band.

In an elastic surface acoustic wave filter device according to another preferred embodiment, one of the elastic surface acoustic wave filters constituting the first set of cascaded elastic surface acoustic wave filters, which has an input/output characteristic that is different by about 180 degrees from the first predetermined value of input/output phase characteristic within the pass band, has a spacing between an electrode finger of an input IDT and an electrode finger of an output IDT that is different by a multiple of any integer plus about 0.5 wavelength from the spacing between an electrode finger of an input IDT and an electrode finger of an output IDT of the other elastic surface acoustic wave filter which has the first predetermined value of input/output phase characteristic within the pass band.

By making the orientation of the input IDT or the output IDT reversed on the side where the IDT is connected and located between the stages, or making the spacing between the input and output IDTs of the relevant filter different by about 0.5 wavelength or a multiple of any integer plus about 0.5 wavelength from that of the other filters, the phase is reversed.

In an elastic surface acoustic wave filter device according to another preferred embodiment, the numbers of electrode fingers of common electrodes connected to the balanced input/output terminals of the elastic surface acoustic wave filters constituting the first set of cascaded elastic surface acoustic wave filters are respectively the same as the numbers of electrode fingers of common electrodes connected to the balanced input/output terminals of the elastic surface acoustic wave filters constituting the second set of cascaded elastic surface acoustic wave filters.

Since the common electrodes on the side led out to the balanced input/output terminals have the same number of electrode fingers for both the first and second sets of cascaded elastic surface acoustic wave filters, direct incoming waves are suppressed with increased attenuation.

In an elastic surface acoustic wave filter device according to a further preferred embodiment, the elastic surface acoustic wave filters constituting the first set of cascaded elastic surface acoustic wave filters and the elastic surface acoustic wave filters constituting the second set of cascaded elastic surface acoustic wave filters are each constituted by IDTs comprising input or output electrode fingers which are even in number.

This feature makes it possible to prevent a change in parasitic capacitance that occurs when a phase is reversed by changing the orientation of the input IDT or the output IDT as described above.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

The present invention will be described hereunder in detail with reference to the drawings.

Figure 1:
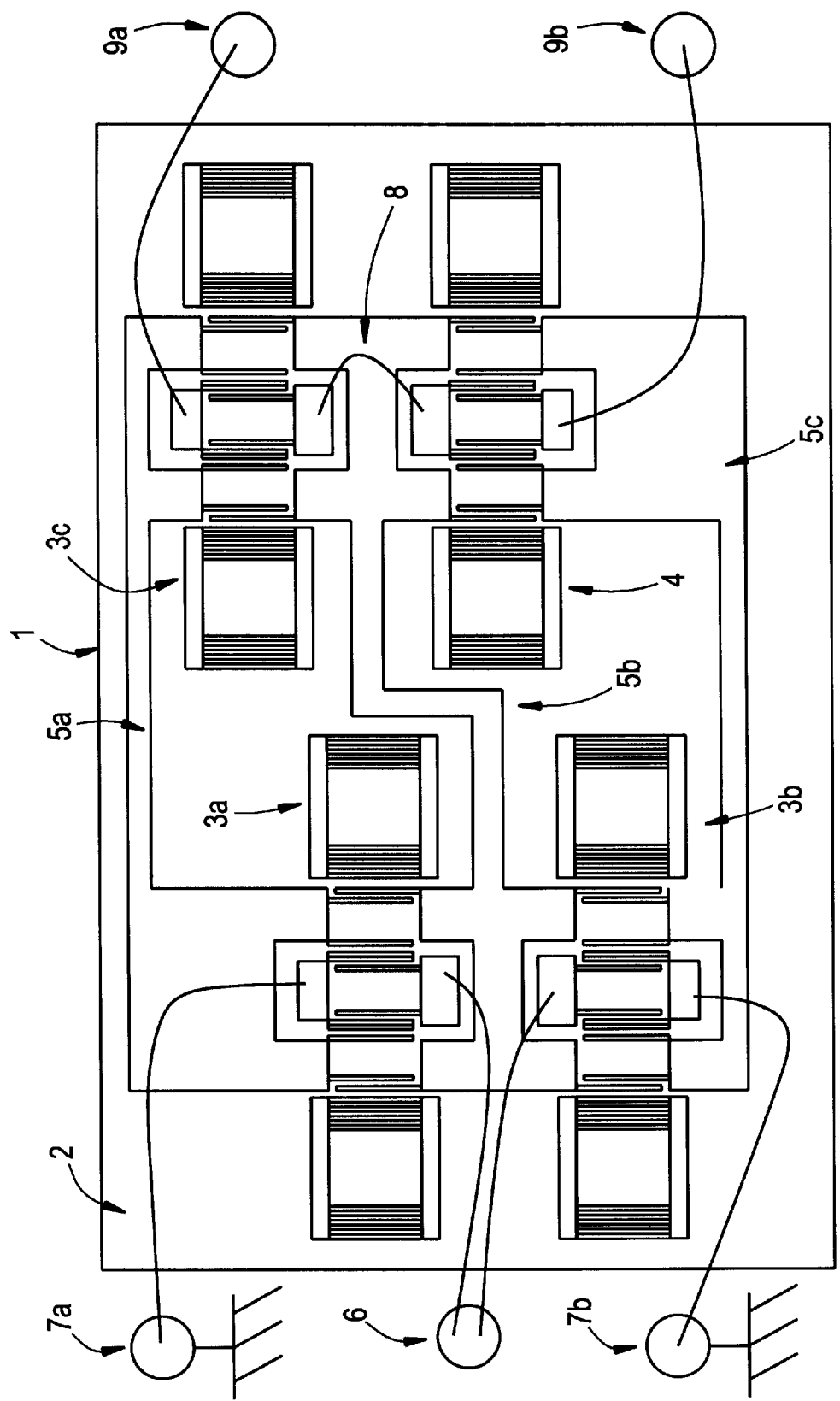
FIG. 1 is a view showing the construction of an elastic surface acoustic wave filter device according to a first preferred embodiment of the present invention.

FIG. 1 is a view showing the construction of an elastic surface acoustic wave filter device according to a first preferred embodiment of the present invention. In FIG. 1, an elastic surface acoustic wave filter device 1 preferably comprises four elastic surface acoustic wave filters 3a, 3b, 3c, 4 provided on a piezoelectric substrate 2, the three elastic surface acoustic wave filters 3a, 3b, 3c having substantially the same amplitude and phase characteristics within the band of the surface acoustic wave device, the remaining elastic surface acoustic wave filter 4 having a phase characteristic that is different by about 180 degrees from that of the above three filters 3a, 3b and 3c.

The elastic surface acoustic wave filters 3a, 3c are electrically connected in a cascade arrangement or "cascaded" through connecting electrodes 5a, 5b, and the elastic surface acoustic wave filters 3b, 4 are also likewise electrically cascaded through connecting electrodes 5b, 5c. Input terminals of the elastic surface acoustic wave filters 3a, 3b are electrically connected in parallel and then led out to an unbalanced input terminal 6 and ground terminals 7a, 7b. On the other hand, the elastic surface acoustic wave filters 3c, 4 are electrically connected in series through a serial connecting electrode 8 and then led out to balanced output terminals 9a, 9b.

Further, the elastic surface acoustic wave filter 3a and the elastic surface acoustic wave filter 3c have input IDTs and output IDTs arranged in the same orientation.

The elastic surface acoustic wave filter 4 has an input IDT arranged in the same orientation as an output IDT of the elastic surface acoustic wave filter 3b, and an output IDT arranged in the opposite orientation relative to an input IDT of the elastic surface acoustic wave filter 3b.

It is to be noted that the IDTs and reflectors of the elastic surface acoustic wave filters are simplified for the sake of convenience because the number of pairs of electrode fingers is too many to illustrate them individually.

In the above structure, the elastic surface acoustic wave filters 3a, 3b, 3c preferably have substantially the same amplitude and phase of input/output transmission characteristic within the band, whereas the elastic surface acoustic wave filter 4 has an input/output phase characteristic that is different by about 180 degrees from that of the above three filters 3a, 3b and 3c.

The operation of the elastic surface acoustic wave filter device thus constructed will be described below. An RF signal from the input side is applied through the unbalanced input terminal 6 and converted into surface acoustic waves in the elastic surface acoustic wave filters 3a, 3b. After that, the surface acoustic waves are converted into an electrical signal again which is led out to the electrodes 5a, 5b, 5c. The input side of the elastic surface acoustic wave filter device 1 is connected to the unbalanced input terminal 6 and the ground terminals 7a, 7b, and therefore includes a ground potential. Since an input signal voltage applied to the unbalanced input terminal 6 with respect to the ground terminals 7a, 7b on the input side is converted into a signal voltage between the balanced terminals 9a, 9b through the elastic surface acoustic wave filter device 1, signals have completely the same amplitude as and the opposite phase relative to the input signal. This result could not be obtained between the balanced output terminals if an effect of the ground potential on the input side reaches the output side. In the elastic surface acoustic wave filter device 1, however, since no ground terminals are provided in the electrodes 5a, 5b, 5c for connection to the elastic surface acoustic wave filters in the downstream stage, the input signal is transmitted to the elastic surface acoustic wave filter 3c and the elastic surface acoustic wave filter 4 without being affected by the ground terminals 7a, 7b. Additionally, since the output IDT of the elastic surface acoustic wave filter 4 has a different orientation to provide a phase reversing function, signals being opposite in phase to each other are obtained at the balanced output terminals 9a, 9b.

Figure 2:
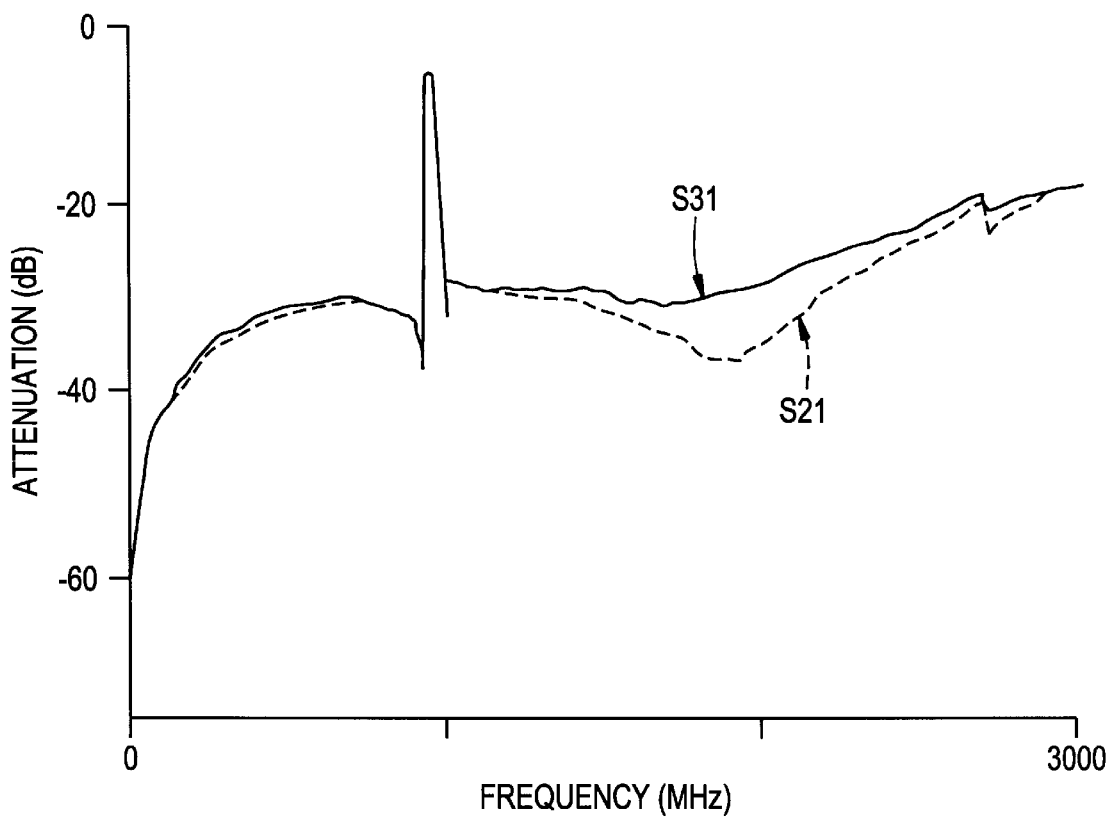
FIG. 2 is a transmission characteristic graph showing the operation of the filter device according to the first preferred embodiment.

FIG. 2 shows transmission characteristics of the elastic surface acoustic wave filter device 1 according to the first preferred embodiment measured on condition of a 50 Ω system, taking the filter device 1 as a 3-port device. In FIG. 2, a solid line represents a transmission characteristic (S31) measured between the unbalanced input terminal 6 (port 1) and the balanced output terminal 9b (port 3) in the first preferred embodiment of FIG. 1, and a broken line represents a transmission characteristic (S21) measured between the unbalanced input terminal 6 (port 1) and the balanced output terminal 9a (port 2). Incidentally, the terminal not included in the measurement is terminated with 50 Ω.

Input/output impedance of the elastic surface acoustic wave filter device 1 will be explained below. The elastic surface acoustic wave filters 3a, 3b, 3c and the elastic surface acoustic wave filter 4 preferably have substantially the same interdigital interval between electrode fingers and the number of pairs of IDTs except that the output IDT of the filter 4 is arranged in the opposite orientation. As a result, all the filters have the same characteristic impedance Z0. Since the elastic surface acoustic wave filters 3a, 3b are electrically connected in parallel, the impedance viewed from the unbalanced input terminal 6 is Z0/2. On the other hand, since the elastic surface acoustic wave filters 3c, 4 are electrically connected in series, the impedance viewed from the balanced input terminals 9a, 9b is 2Z0. Accordingly, if the individual elastic surface acoustic wave filters are designed to provide characteristic impedance of 100 Ω, for example, an elastic surface acoustic wave filter device having input impedance of 50 Ω and output impedance of 200 Ω can be realized.

While in the first preferred embodiment, the elastic surface acoustic wave filter 4 has the input IDT arranged in the same orientation as the output IDT of the elastic surface acoustic wave filter 3b, and the output IDT arranged in the opposite orientation to the input IDT of the elastic surface acoustic wave filter 3b, the present invention is not limited to the first preferred embodiment. On the contrary, the elastic surface acoustic wave filter 4 may have the input IDT arranged in the opposite orientation relative to the output IDT of the elastic surface acoustic wave filter 3b, and the output IDT of the elastic surface acoustic wave filter 4 arranged in the same orientation as the input IDT of the elastic surface acoustic wave filter 3b.

A second preferred embodiment will be described below.

Figure 3:
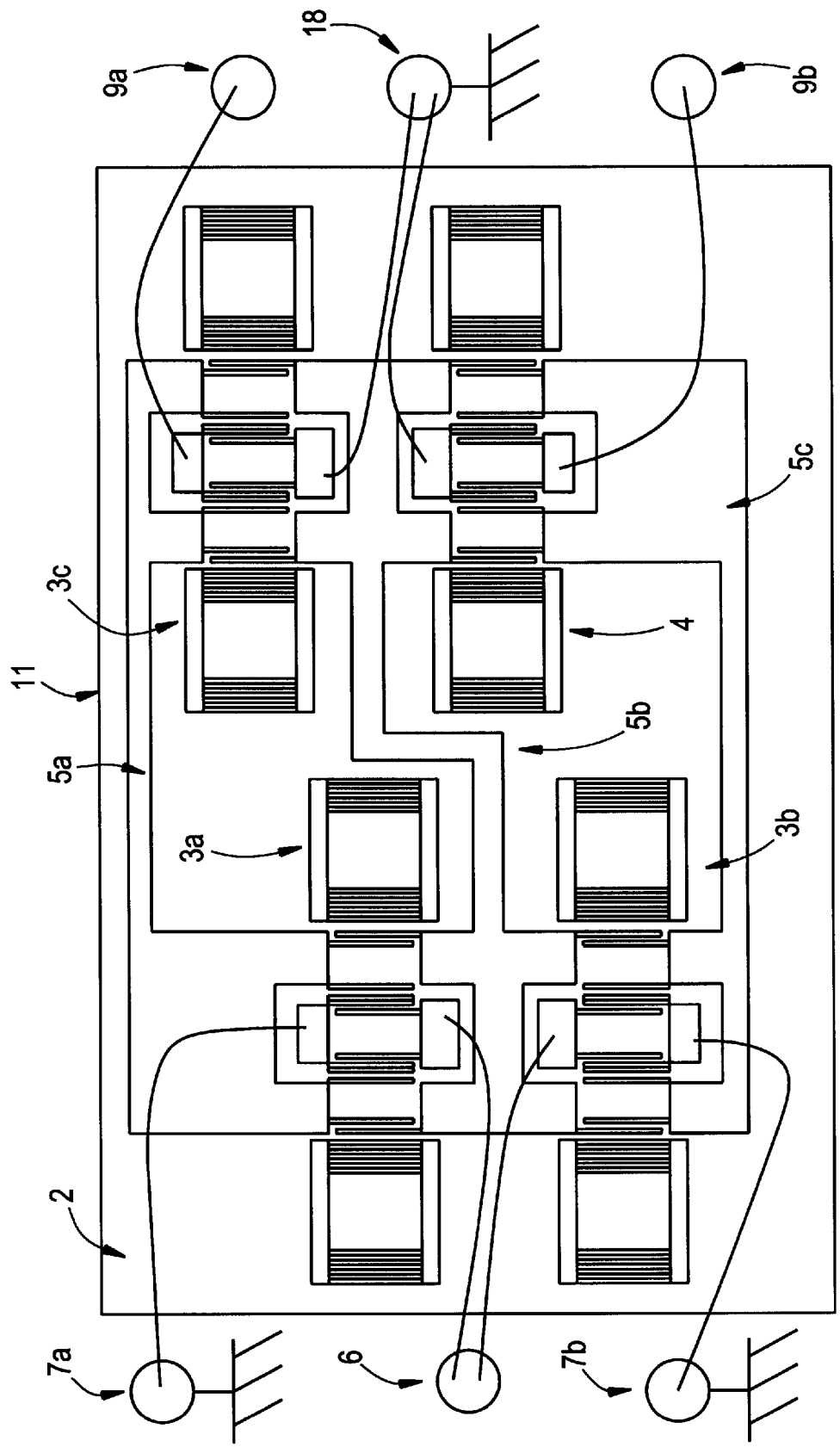
FIG. 3 is a view showing the construction of an elastic surface acoustic wave filter device according to a second preferred embodiment of the present invention.

FIG. 3 is a view showing the construction of an elastic surface acoustic wave filter device 11 according to a second preferred embodiment of the present invention. Because the basic construction of the elastic surface acoustic wave filter device 11 is preferably similar to that of the first preferred embodiment, the same structural elements as those in the first preferred embodiment shown in FIG. 1 are denoted by the same reference numerals and are not described here in detail.

As shown in FIG. 3, the elastic surface acoustic wave filter device 11 preferably comprises four elastic surface acoustic wave filters provided on the piezoelectric substrate 2.

This second preferred embodiment differs from the first preferred embodiment in that, instead of the output IDTs of the elastic surface acoustic wave filters 3c, 4 being electrically connected in series through the serial connecting electrode 8 as in the first preferred embodiment, the output IDTs of the elastic surface acoustic wave filters 3c, 4 are both led to a ground terminal 18 in the second preferred embodiment.

Figure 4:
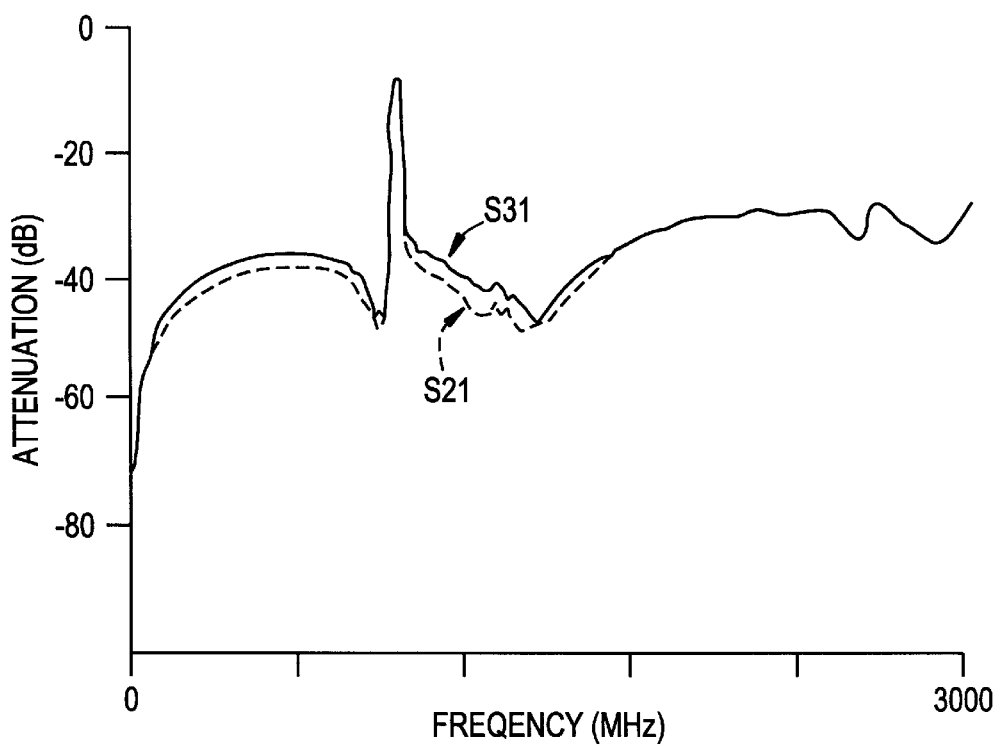
FIG. 4 is a transmission characteristic graph showing the operation of the filter device according to the second preferred embodiment, the graph illustrating two transmission characteristics measured between an unbalanced input terminal and each of balanced output terminals.

FIG. 4 shows, similarly to FIG. 2, transmission characteristics (S21 and S31) of the elastic surface acoustic wave filter device 11 according to the second preferred embodiment. Specifically, in FIG. 4, a solid line represents a transmission characteristic (S31) measured between the unbalanced input terminal 6 (port 1) and the balanced output terminal 9b (port 3), and a broken line represents a transmission characteristic (S21) measured between the unbalanced input terminal 6 (port 1) and the balanced output terminal 9a (port 2). Incidentally, the terminal not included in the measurement is terminated with 50 Ω. As will be seen from FIG. 4, attenuation is improved by about 10 dB for directly incoming waves in the vicinity of 1 GHz in comparison with the transmission characteristic of the first preferred embodiment shown in FIG. 2.

Figure 5:
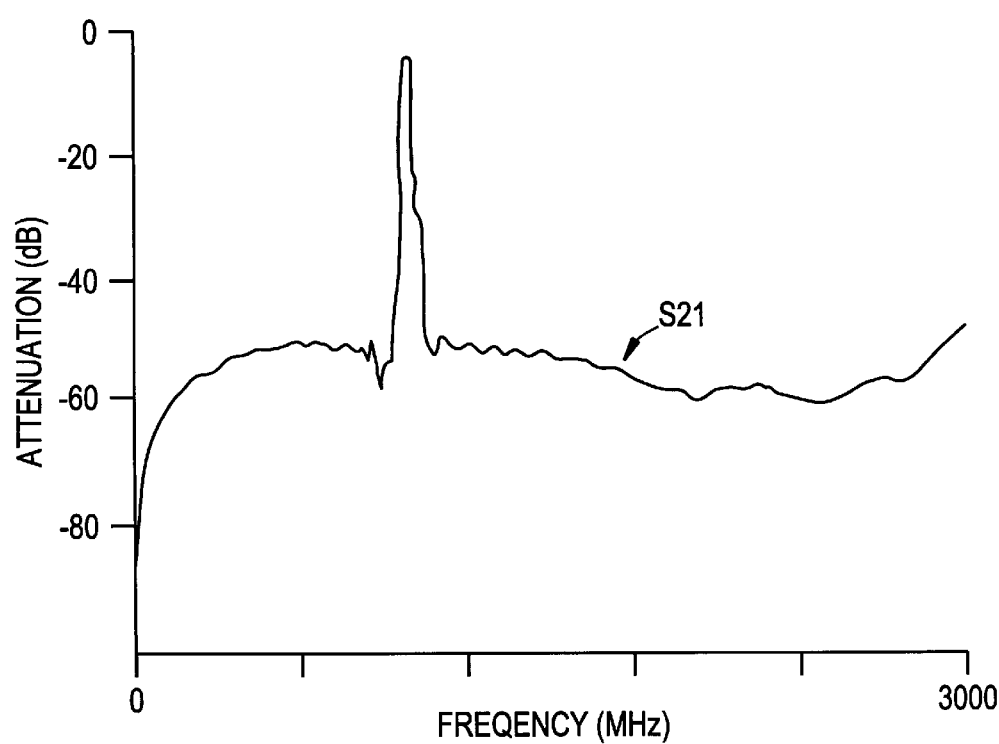
FIG. 5 is a transmission characteristic graph showing the operation of the filter device according to the second preferred embodiment, the graph illustrating a transmission characteristic measured when a signal is obtained from an unbalanced output terminal through a balun.

FIG. 5 shows a transmission characteristic (S21) resulting from this second preferred embodiment after the balanced output operation. The result of FIG. 5 represents the transmission characteristic measured when a transformer (balun) for transforming a balanced output on the order of 200 Ω into an unbalanced output on the order of 50 Ω is connected to the balanced output terminals 9a, 9b of the elastic surface acoustic wave filter device 11 and a signal is obtained from the balun.

With the construction of the second preferred embodiment, since the balanced operation with a neutral potential provided by the ground potential is achieved, it is possible to provide an elastic surface acoustic wave filter device which suppresses directly incoming waves more effectively than with the floating operation and is superior in suppressing unnecessary waves.

A third preferred embodiment will be described below.

Figure 6:
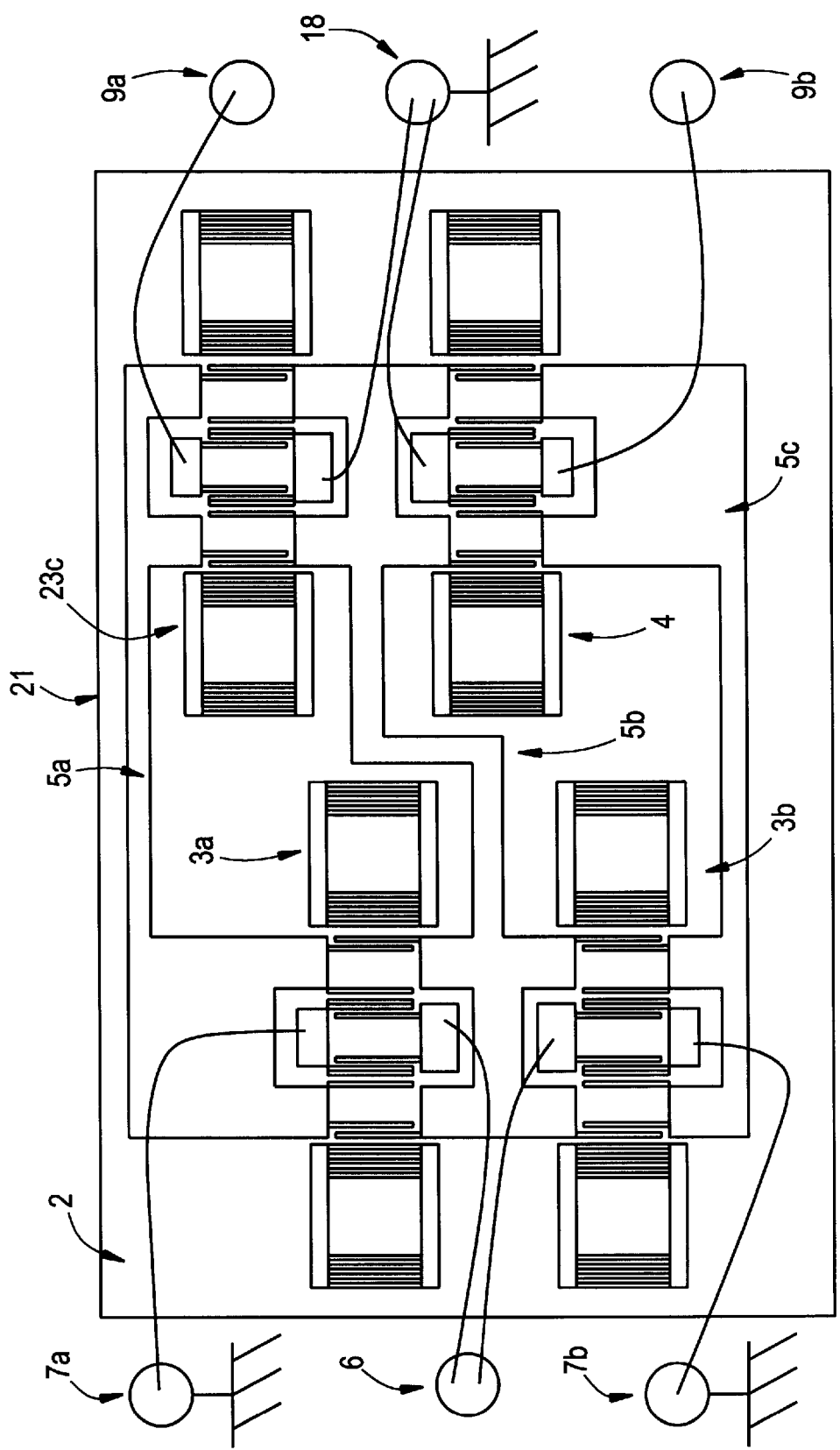
FIG. 6 is a view showing the construction of an elastic surface acoustic wave filter device according to a third preferred embodiment of the present invention.

FIG. 6 is a view showing the construction of an elastic surface acoustic wave filter device 21 according to a third preferred embodiment of the present invention. Because the basic construction of the elastic surface acoustic wave filter device 21 is similar to that of the second preferred embodiment, the same structural elements as those in the second preferred embodiment are denoted by the same reference numerals and are not described here in detail.

This third preferred embodiment differs from the second preferred embodiment in that, instead of the elastic surface acoustic wave filters 3a, 3c having the input IDTs and the output IDTs both arranged in the same orientation in the second preferred embodiment, an input IDT and an output IDT of an elastic surface acoustic wave filter 23c are arranged in the opposite orientation relative to the input IDT and the output IDT of the elastic surface acoustic wave filter 3a.

Such a construction is used so that a common electrode for electrode fingers on the side connected to the balanced output terminal 9a of the elastic surface acoustic wave filter 23c and a common electrode for electrode fingers on the side connected to the balanced output terminal 9b of the elastic surface acoustic wave filter 4 each cover the same number of electrode fingers.

Specifically, as shown in FIG. 6, in order for the output IDT of the elastic surface acoustic wave filter 23c to be connected to the balanced output terminal 9a, one common electrode having electrode fingers located at outermost positions in the output IDT that is connected to the ground terminal 18, and the other common electrode is connected to the balanced output terminal 9a. In order for the output IDT of the elastic surface acoustic wave filter 4 to be connected to the balanced output terminal 9b, one common electrode having electrode fingers located at outermost positions in the output IDT is connected to the ground terminal 18, and the other common electrode is connected to the balanced output terminal 9b.

Contrary to FIG. 6, the construction may be modified such that, in order for the output IDT of the elastic surface acoustic wave filter 23c to be connected to the balanced output terminal 9a, one common electrode having electrode fingers located at outermost positions in the output IDT that is directly connected to the balanced output terminal 9a, and in order for the output IDT of the elastic surface acoustic wave filter 4 to be connected to the balanced output terminal 9b, one common electrode having electrode fingers located at outermost positions in the output IDT that is directly connected to the balanced output terminal 9b, and the other common electrodes of the respective output IDTs are connected to the ground terminal 18. In any of these constructions, it is essential that the number of electrode fingers of the common electrode on the side of the elastic surface acoustic wave filter 23c connected to the balanced output terminal 9a and the number of electrode fingers of the common electrode on the side of the elastic surface acoustic wave filter 4 connected to the balanced output terminal 9b are set equal to each other; i.e., those common electrodes are set to have the same number of electrode fingers.

Figure 7:
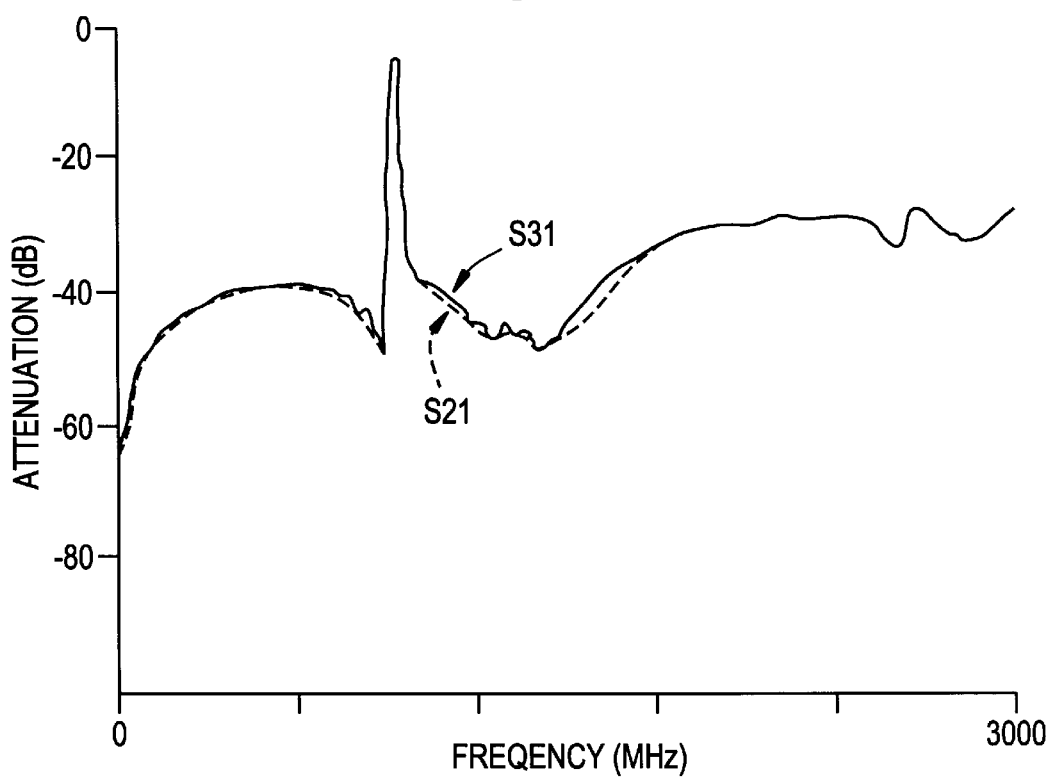
FIG. 7 is a transmission characteristic graph showing the operation of the filter device according to the third preferred embodiment, the graph illustrating two transmission characteristics measured between an unbalanced input terminal and each of balanced output terminals.

An advantage of this third preferred embodiment will be explained below in detail. FIG. 7 shows transmission characteristics of the elastic surface acoustic wave filter device 21 according to the third preferred embodiment measured on condition of a 50 Ω system, taking the filter device 21 as a 3-port device. In FIG. 7, a solid line represents a transmission characteristic (S31) measured between the unbalanced input terminal 6 (port 1) and the balanced output terminal 9b (port 3), and a broken line represents a transmission characteristic (S21) measured between the unbalanced input terminal 6 (port 1) and the balanced output terminal 9a (port 2). Incidentally, the terminal not included in the measurement is terminated with 50 Ω.

Figure 8:
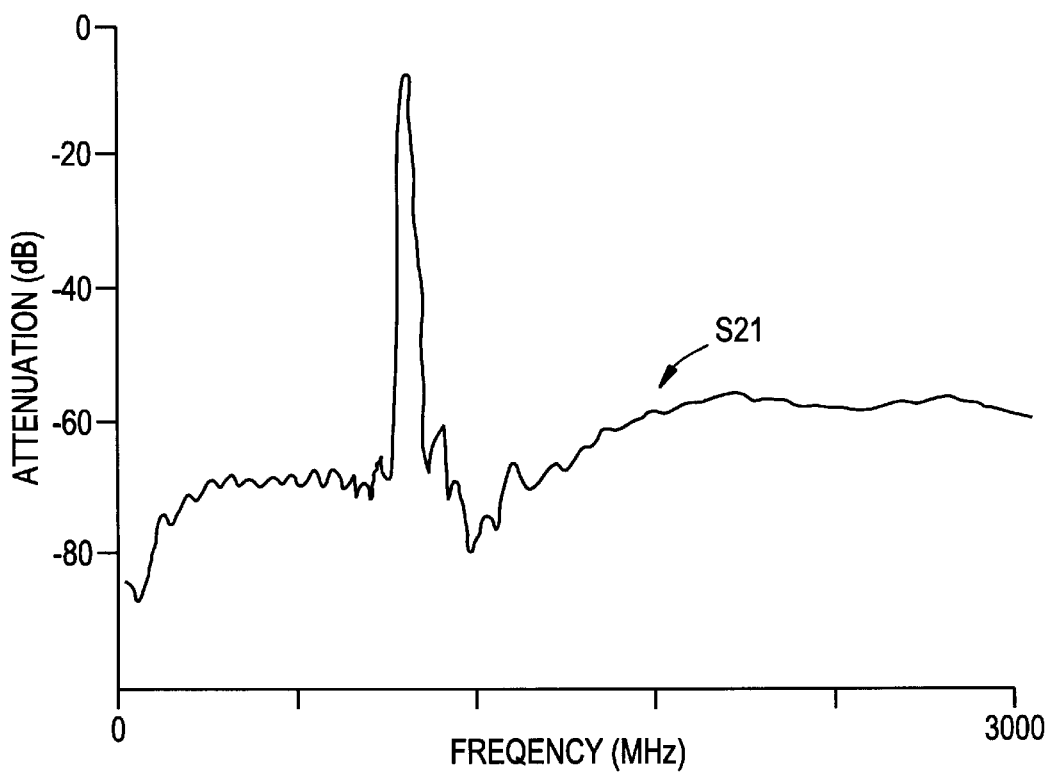
FIG. 8 is a transmission characteristic graph showing the operation of the filter device according to the third preferred embodiment, the graph illustrating a transmission characteristic measured when a signal is obtained from an unbalanced output terminal through a balun.

To achieve a high S/N ratio in the balanced output operation, it is desired that the filter device has transmission characteristics having the same amplitude and opposite phase within the band in which necessary signals pass, and transmission characteristics of the same amplitude and phase outside the pass band where there exist unnecessary signals. It is also apparent that, outside the pass band, a transmission characteristic of the same phase can be obtained because the directly incoming wave components are are suppressed less effectively than in the third preferred embodiment, but a suppression degree is deteriorated if there is a slight amplitude difference. As will be seen from the result of FIG. 7, according to this third preferred embodiment, signals obtained at the balanced output terminals have the same amplitude outside the pass band. FIG. 8 shows a transmission characteristic (S21) resulting from this third preferred embodiment after the balanced output operation . The result of FIG. 8 represents the transmission characteristic measured when a transformer (balun) for transforming a balanced output on the order of 200 Ω into an unbalanced output on the order of 50 Ω is connected to the balanced output terminals 9a, 9b of the elastic surface acoustic wave filter device 21 and a signal is obtained from the balun. Comparing FIG. 5 illustrating the results achieved by the second preferred embodiment and FIG. 8 illustrating the results achieved by the third preferred embodiment, it is apparent that directly incoming waves are suppressed more effectively with this third preferred embodiment.

A fourth preferred embodiment will be described below.

Figure 9:
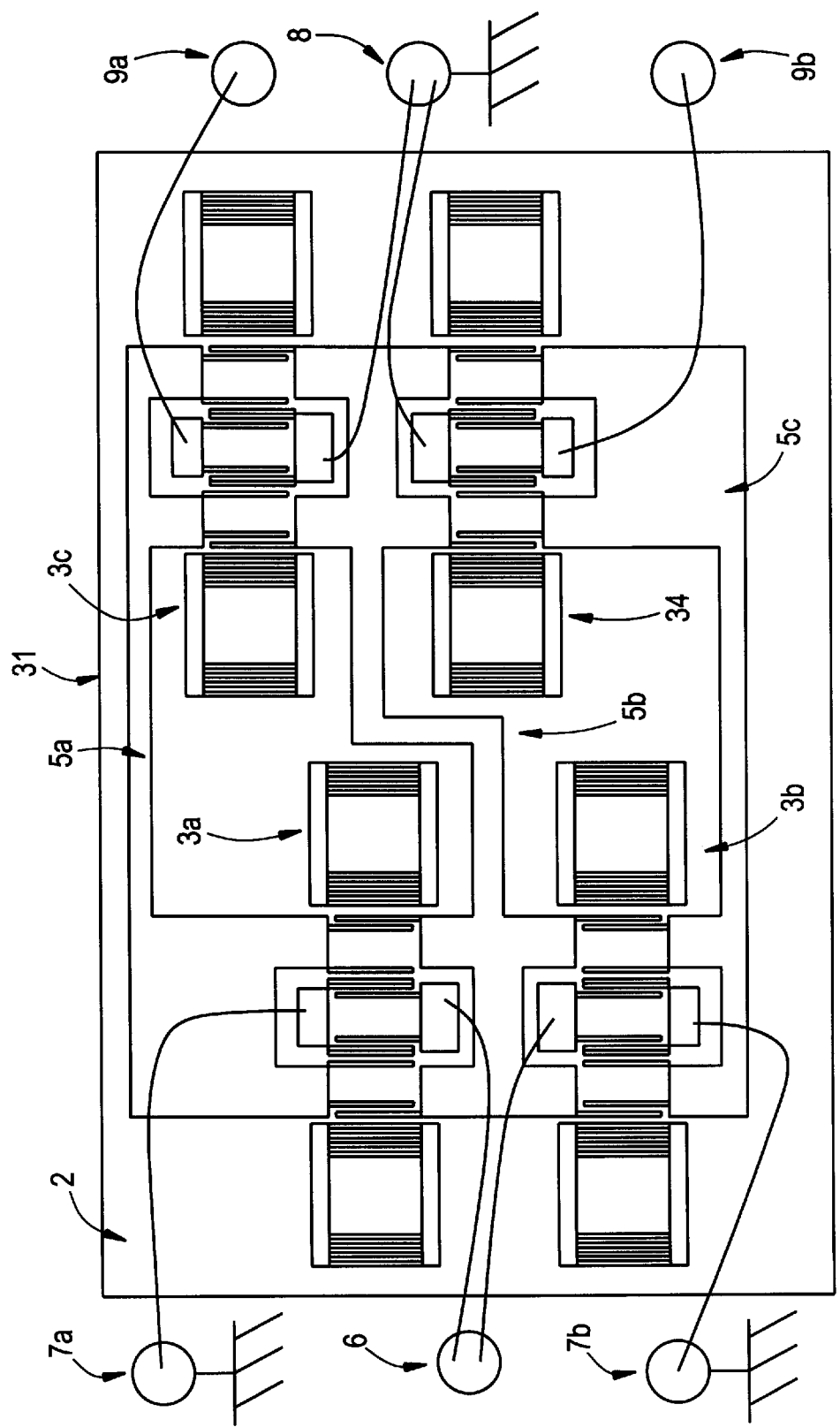
FIG. 9 is a view showing the construction of an elastic surface acoustic wave filter device according to a fourth preferred embodiment of the present invention.

FIG. 9 is a view showing the construction of an elastic surface acoustic wave filter device 31 according to a fourth preferred embodiment of the present invention. Because the basic construction of the elastic surface acoustic wave filter device 31 is similar to that of the second preferred embodiment, the same elements as those in the second preferred embodiment are denoted by the same reference numerals and are not described here in detail.

This fourth preferred embodiment differs from the second preferred embodiment in that instead of the output IDT of the elastic surface acoustic wave filter 4 being different in orientation compared to the second preferred embodiment, the fourth preferred embodiment uses an elastic surface acoustic wave filter 34 modified such that the spacing between an electrode finger of an input IDT and an electrode finger of an output IDT is different by about 0.5 wavelength from that of the other elastic surface acoustic wave filters 3a, 3b, 3c, while the input or output IDT has the same orientation.

Figure 10:
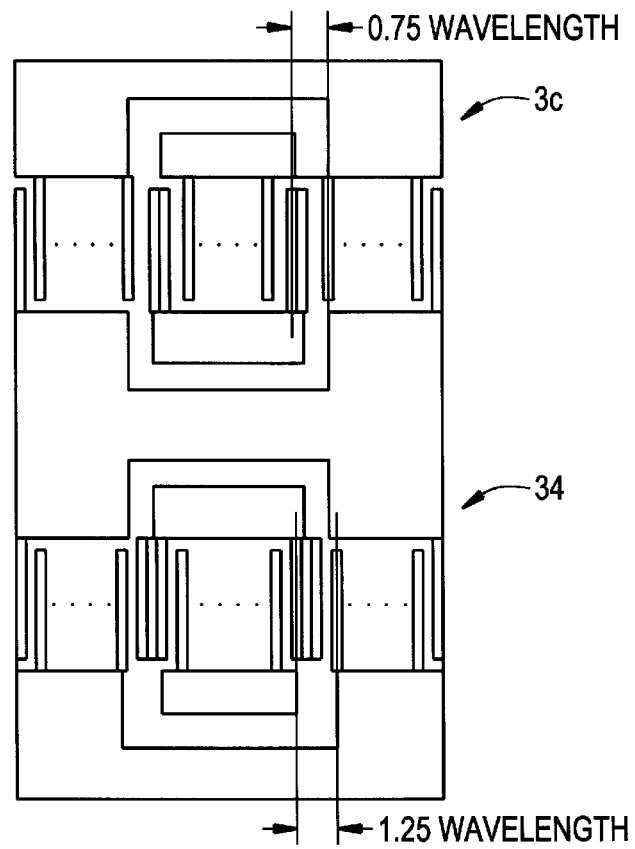
FIG. 10 is a partial detailed view showing the relationship in spacing from an input IDT to an output IDT between an elastic surface acoustic wave filter 3c and an elastic surface acoustic wave filter 34.

FIG. 10 is a partial enlarged view of the vicinity of the elastic surface acoustic wave filter 3c and the elastic surface acoustic wave filter 34. As shown in FIG. 10, the spacing between the adjacent electrode fingers of the input and output IDTs of the elastic surface acoustic wave filter 3c is preferably set to about 0.75 wavelength. Also, though not shown in FIG. 10, the spacing between the adjacent electrode fingers of the input and output IDTs of the elastic surface acoustic wave filters 3a, 3b, 3c is likewise preferably set to about 0.75 wavelength. On the other hand, the spacing between the adjacent electrode fingers of the input and output IDTs of the elastic surface acoustic wave filter 34 is preferably set to about 1.25 wavelength. Thus, the spacing between the adjacent electrode fingers of the input and output IDTs of the elastic surface acoustic wave filter 34 is different by about 0.5 wavelength from that of the other elastic surface acoustic wave filters 3a, 3b, 3c.

By making the spacing between the adjacent electrode fingers of the input and output IDTs of the elastic surface acoustic wave filter 34 different by about 0.5 wavelength from that of the other elastic surface acoustic wave filters 3a, 3b, 3c in this preferred embodiment, an input/output phase characteristic of the elastic surface acoustic wave filter 34 can also be made different by about 180 degrees from that of the other elastic surface acoustic wave filters 3a, 3b, 3c as with the structure of the first and second preferred embodiments where the orientation of the output IDT is made different.

Note that a difference in the spacing between the adjacent electrode fingers of the input and output IDTs is not limited to about 0.5 wavelength, and a similar advantage is achieved if the difference is a multiple of any integer plus about 0.5 wavelength.

Figure 11:
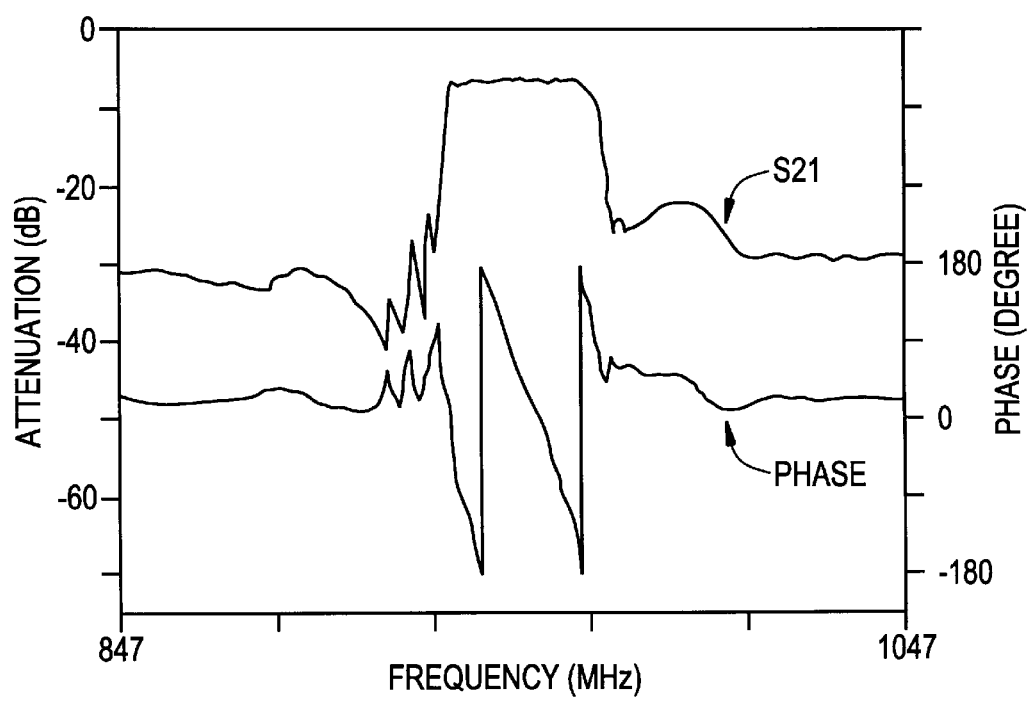
FIG. 11 is a transmission characteristic graph showing the operation of the filter device according to the third preferred embodiment, the graph illustrating a transmission characteristic measured between an unbalanced input terminal (port 1) and a balanced output terminal (port 2).
Figure 12:
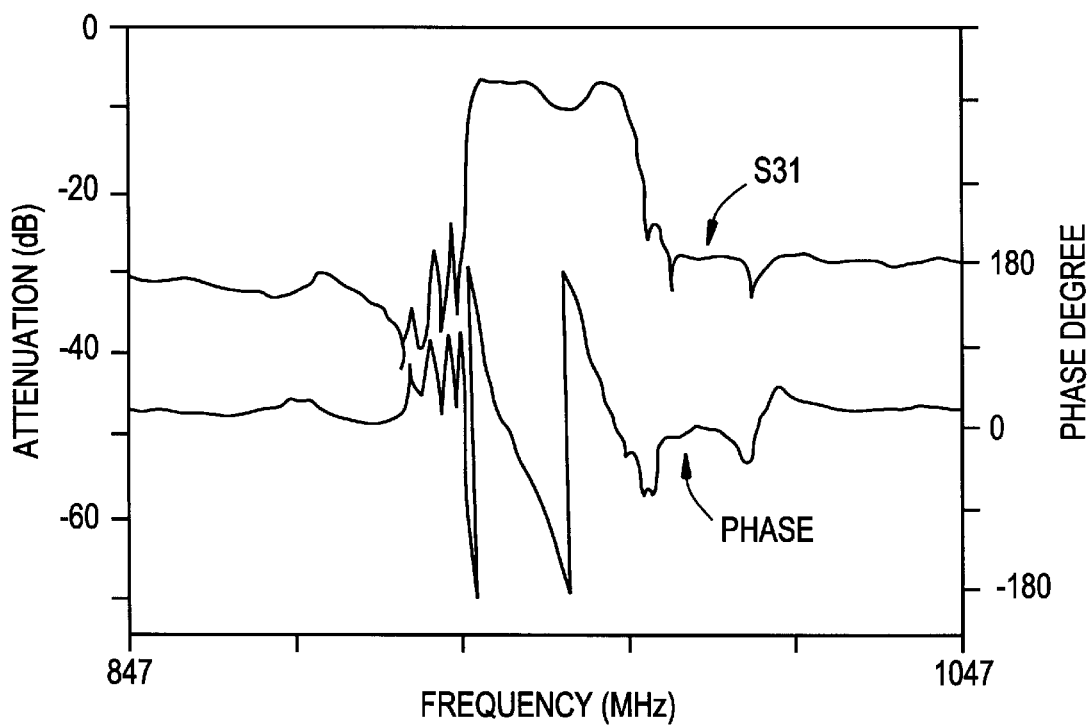
FIG. 12 is a transmission characteristic graph showing the operation of the filter device according to the third preferred embodiment, the graph plotting a transmission characteristic measured between the unbalanced input terminal (port 1) and a balanced output terminal (port 3).

The advantages of the fourth preferred embodiment will be explained in more detail. FIGS. 11 and 12 show results of respectively measuring a transmission characteristic (S21) between the port 1 and the port 2 and a transmission characteristic (S31) between the port 1 and the port 3 in the elastic surface acoustic wave filter device 21 according to the third preferred embodiment, particularly in the vicinity of the pass band, in the same manner as explained above in connection with the second and third preferred embodiments, taking the filter device 21 as a 3-port device. As will be seen from these results, in the transmission characteristic (S31) shown in FIG. 12, a ripple occurs within the pass band due to an effect caused by the elastic surface acoustic wave filter subjected to reversing of phase, and therefore the amplitude of S31 is not equal to that of S21. The reason is probably that since the orientation of one or two IDTs is reversed in the construction of the first to third preferred embodiments, the amplitude and phase are disturbed upon the electrode fingers inherently kept at the ground potential changing to the electrode fingers on the signal side.

Figure 13:
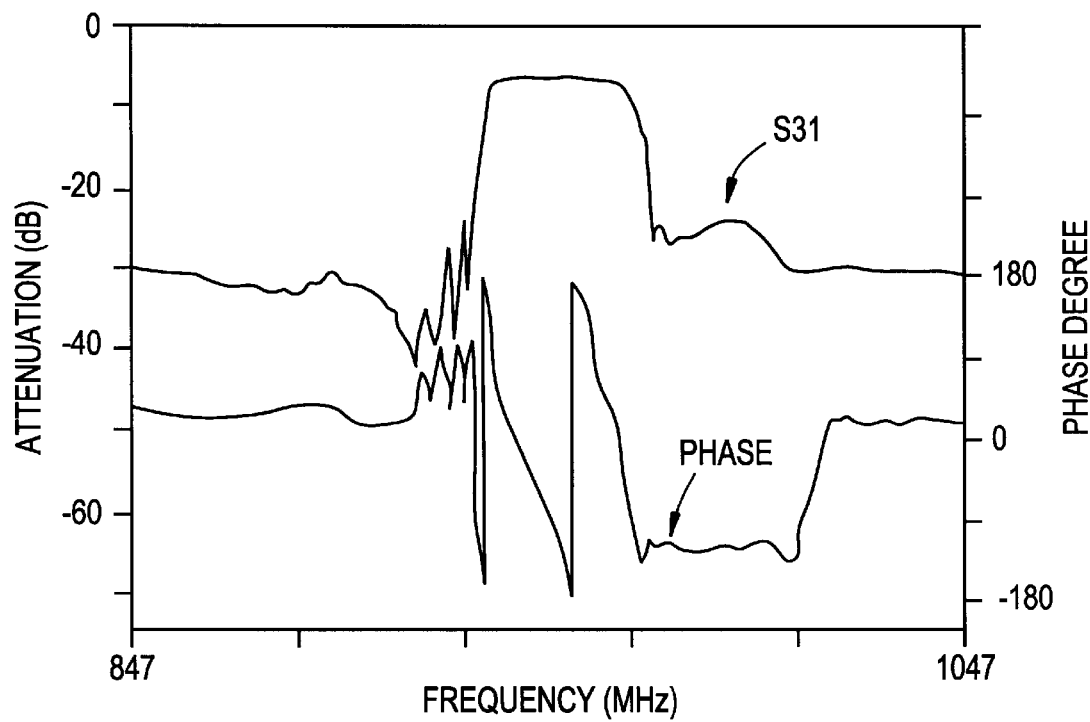
FIG. 13 is a transmission characteristic graph showing the operation of the filter device according to the fourth preferred embodiment, the graph illustrating a transmission characteristic measured between an unbalanced input terminal (port 1) and a balanced output terminal (port 3).

To solve the above problem, the input/output phase characteristic is reversed in this fourth preferred embodiment by changing not the orientation of the IDT, but the distance of a signal propagation path so that the amplitude and phase are not disturbed. FIG. 13 shows a transmission characteristic S31 resulting from this fourth preferred embodiment. As will be seen from FIG. 13, the ripple within the pass band is eliminated. Incidentally, a transmission characteristic S21 resulting from this fourth preferred embodiment is the same as shown in FIG. 11.

A fifth preferred embodiment will be described below.

Figure 14:
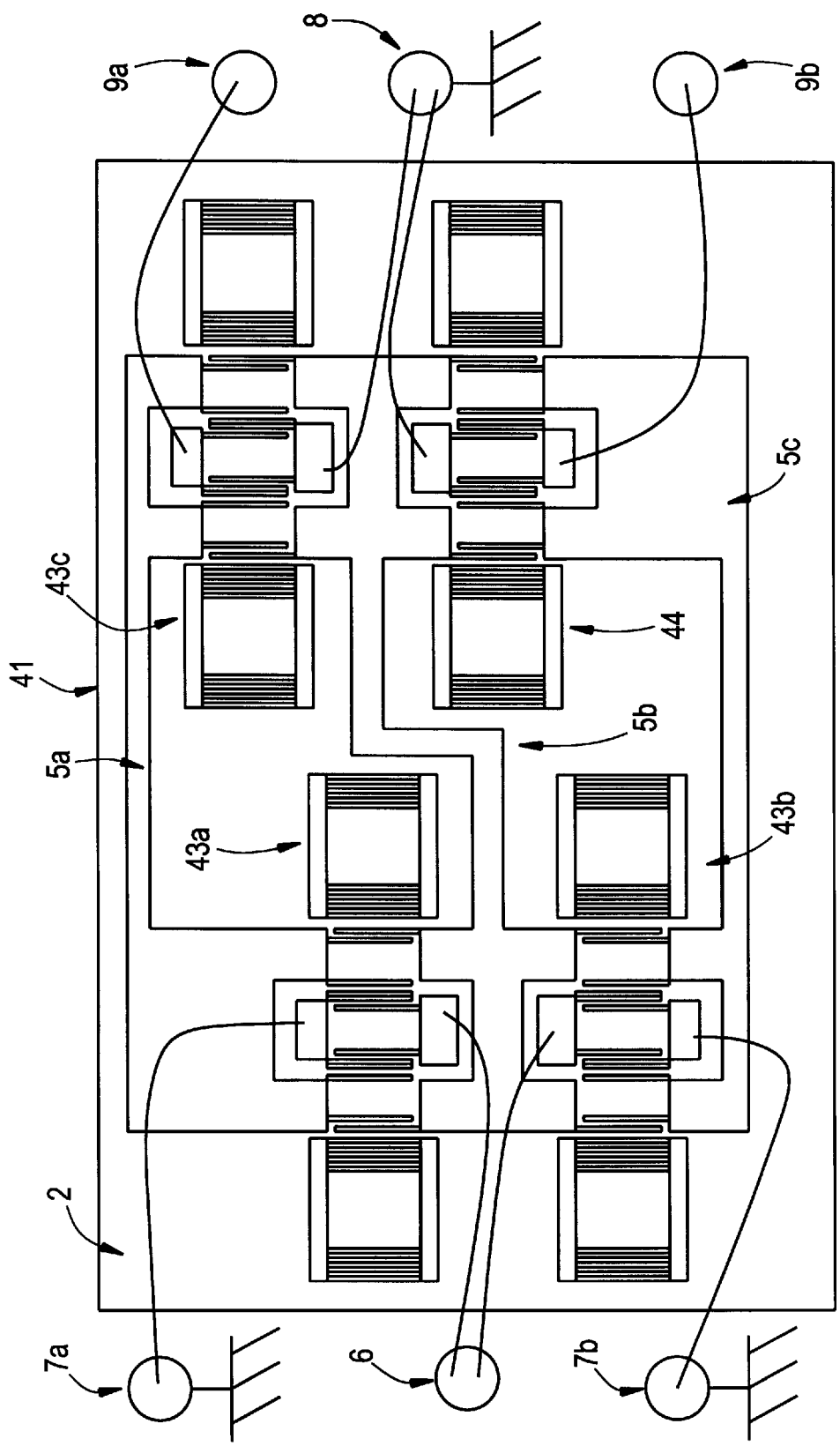
FIG. 14 is a view showing the construction of an elastic surface acoustic wave filter device according to a fifth preferred embodiment of the present invention.

FIG. 14 is a view showing the construction of an elastic surface acoustic wave filter device 41 according to a fifth preferred embodiment of the present invention. Because the basic construction of the elastic surface acoustic wave filter device 41 is similar to that of the second preferred embodiment, the same elements as those in the second preferred embodiment are denoted by the same reference numerals and are not described here in detail.

This fifth preferred embodiment differs from the second preferred embodiment in that input IDTs of elastic surface acoustic wave filters 43a, 43b and output IDTs of elastic surface acoustic wave filters 43c, 44 all have electrode fingers which are even in number. Similar to the second preferred embodiment, an output IDT of the elastic surface acoustic wave filter 44 is reversed in orientation to provide a phase reversing function with respect to the other elastic surface acoustic wave filters 43a, 43b, 43c.

In the elastic surface acoustic wave filter device 41 of FIG. 14, since all the IDTs of the elastic surface acoustic wave filters 43a, 43b, 43c and 44 on the side led out to the external terminals have electrode fingers which are even in number, there is no change in parasitic capacitance even with the orientation of the IDT reversed. As with the fourth preferred embodiment, therefore, it is possible to prevent the amplitude and phase from being disturbed upon the electrode fingers inherently kept at the ground potential changing to the electrode fingers on the signal side as a result of reversing the orientation of the IDT.

A sixth preferred embodiment will be described below.

Figure 15:
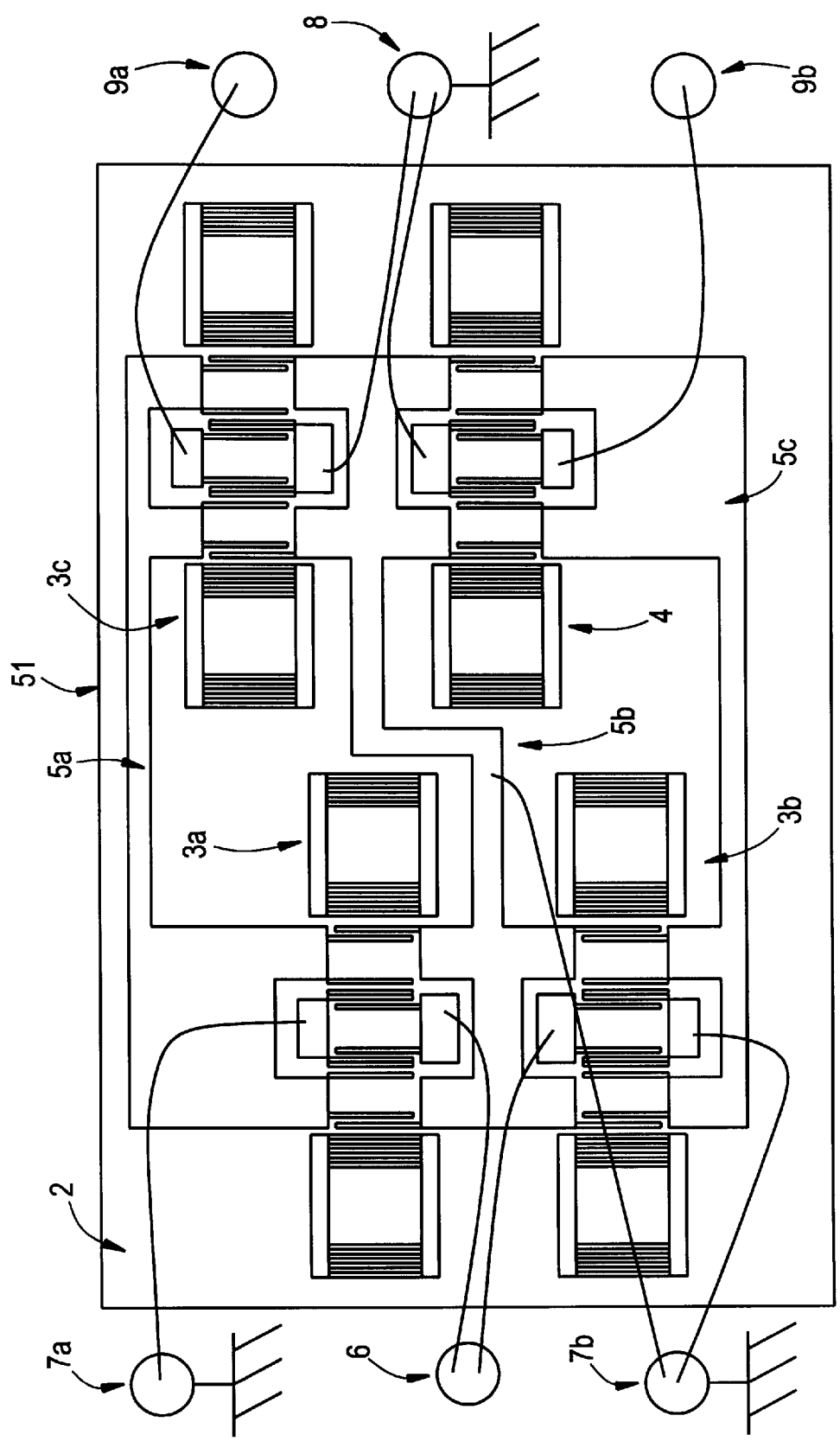
FIG. 15 is a view showing the construction of an elastic surface acoustic wave filter device according to a sixth preferred embodiment of the present invention.

FIG. 15 is a view showing the construction of an elastic surface acoustic wave filter device 51 according to a sixth preferred embodiment of the present invention. Because the basic construction of the elastic surface acoustic wave filter device 51 is similar to that of the fourth preferred embodiment, the same elements as those in the fourth preferred embodiment are denoted by the same reference numerals and are not described here in detail.

This fifth preferred embodiment differs from the fourth preferred embodiment in that, as shown in FIG. 15, the connecting electrode 5b for cascading the elastic surface acoustic wave filter 3a to the elastic surface acoustic wave filter 3c and the elastic surface acoustic wave filter 3b to the elastic surface acoustic wave filter 4 is connected to the ground terminal 7b.

The above structure makes it possible to suppress the effect of directly incoming waves in the vicinity of the pass band. Note that the similar advantage can also be provided by grounding, instead of the connecting electrode 5b, other two 5a, 5c of the connecting electrodes 5a, 5b, 5c for cascading the elastic surface acoustic wave filter 3a to the elastic surface acoustic wave filter 3c and the elastic surface acoustic wave filter 3b to the elastic surface acoustic wave filter 4.

With the construction of FIG. 15 illustrating the sixth preferred embodiment, since the effect of directly incoming waves in the vicinity of the pass band is suppressed, attenuation can be increased, particularly, on the higher-frequency side of the pass band.

As with the fourth preferred embodiment explained above, the construction of this sixth preferred embodiment prevents the amplitude and phase from being disturbed upon the electrode fingers inherently kept at the ground potential changing to the electrode fingers on the signal side. Accordingly, although one electrode 5b or two electrodes 5a, 5c of the electrodes 5a, 5b, 5c are connected between the elastic surface acoustic wave filters 3a and 3c and between the elastic surface acoustic wave filters 3b and 4, amplitude and phase characteristics within the pass band are not disturbed on the balanced output side.

Figure 16:
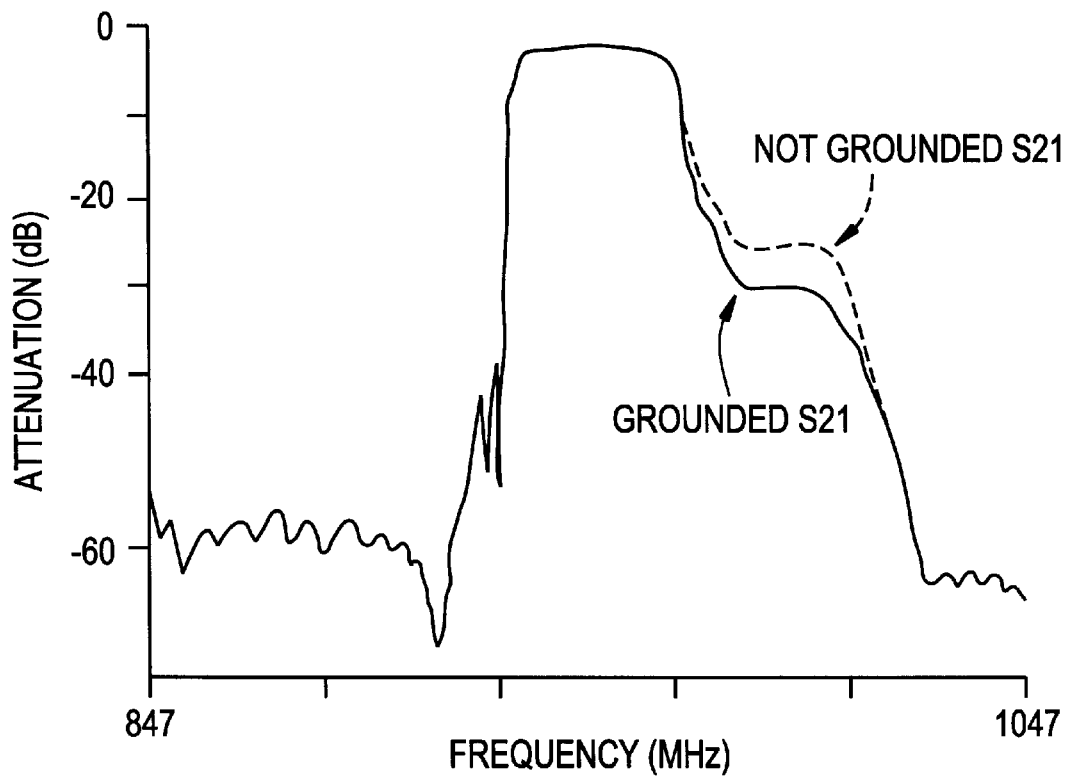
FIG. 16 is a transmission characteristic graph showing the operation of the filter device according to the sixth preferred embodiment, the graph illustrating a transmission characteristic measured when a signal is obtained from an unbalanced output terminal through a balun.
Figure 17:
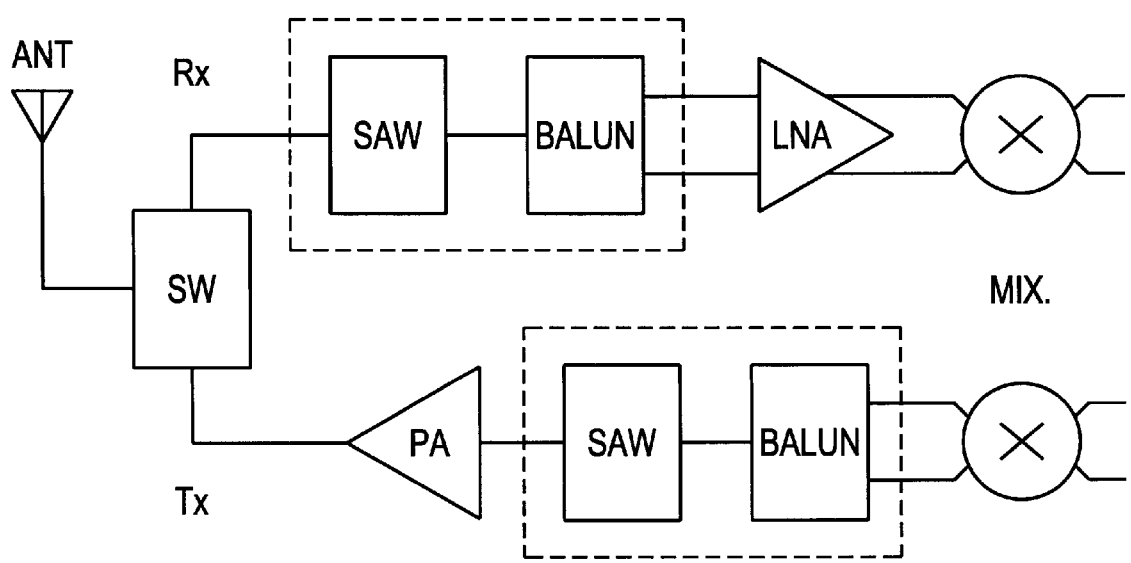
FIG. 17 is a block diagram showing an example of an elastic surface acoustic wave filter used in a mobile body communication terminal.
Figure 18:
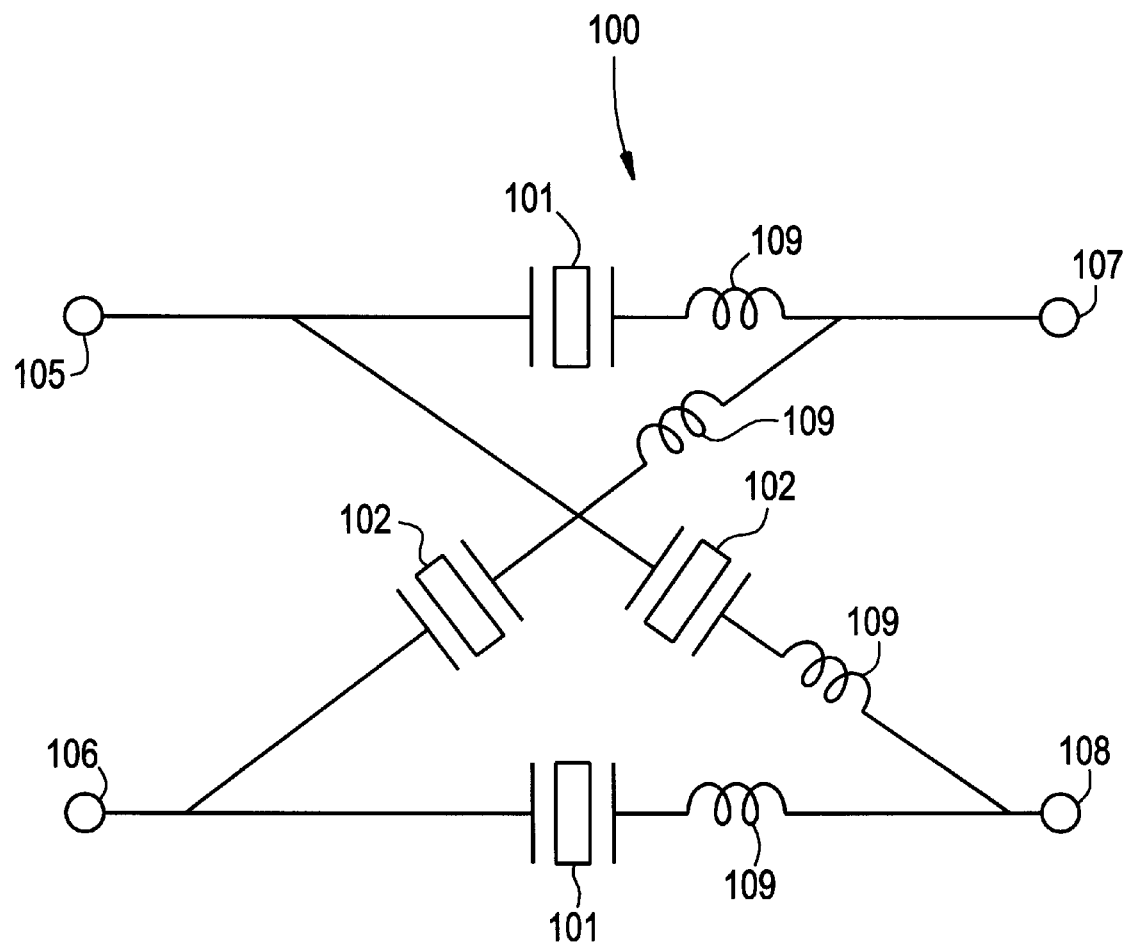
FIG. 18 is a schematic view showing the construction of a conventional elastic surface acoustic wave filter device of balanced input-to-unbalanced output type.

FIG. 16 shows a change in transmission characteristic resulting from this sixth preferred embodiment when the electrode 5b is grounded. The plotted characteristic was measured through a balun by using a network analyzer (50 Ω system). Comparing with the case of the electrode 5b being not grounded (indicated by a broken line in FIG. 16), it is apparent that attenuation is improved from 25 dB to 30 dB on the higher-frequency side of the pass band according to the construction of this sixth preferred embodiment.

It is to be noted that while the above first to sixth preferred embodiments have been all described in connection with, by way of example, a construction of unbalanced input-to-balanced output, the manner of connecting the filters may be reversed from that explained above if a construction of balanced input-to-unbalanced output is required.

In addition, the similar advantages can be obtained without being affected by substrate materials.

According to the preferred embodiments of the present invention, since elastic surface acoustic wave filters are cascaded in multiple stages and the filter device has a construction such that IDTs connected between the stages have no ground terminals, the filter device provides a buffer effect. Further, since two elastic surface acoustic wave filters are connected in parallel on the input side and two elastic surface acoustic wave filters are connected in series on the output side with one of the two filters providing a reversed phase, output impedance is about four times as much as input impedance and a balanced output is obtained.

According to further features of the preferred embodiments of the present invention, since the balanced operation with a neutral potential given by the ground potential is achieved, it is possible to provide an elastic surface acoustic wave filter device which suppresses directly incoming waves more effectively than with the floating operation and is superior in suppressing unnecessary waves.

According to further features of the preferred embodiments of the present invention, by making the orientation of the input IDT or the output IDT reversed on the side where the IDT is connected so as to be located between the cascaded stages, or making the spacing between the input and output IDTs of the relevant filter different by about 0.5 wavelength or a multiple of any integer plus about 0.5 wavelength from that of the other filters, the phase can be reversed.

Particularly, according to further features of the preferred embodiments of the present invention, since the phase is reversed by making the spacing between the input and output IDTs of the relevant filter different by about 0.5 wavelength or a multiple of any integer plus about 0.5 wavelength from that of the other filters, disturbances of the amplitude and phase caused upon the electrode fingers inherently kept at the ground potential changing to the electrode fingers on the signal side are prevented.

According to additional features of the preferred embodiments of the present invention, since the common electrodes on the side connected to the balanced input/output terminals have the same number of electrode fingers for both the first and second sets of cascaded elastic surface acoustic wave filters, directly incoming waves are suppressed with increased attenuation.

According to additional features of the preferred embodiments of the present invention, since all the IDTs of the elastic surface acoustic wave filters on the side led out to external terminals comprise electrode fingers are even in number, the effect of parasitic capacitance is equal between two terminals on the balanced output side even with the orientation of the IDT reversed. As a result, signals obtained from the balanced terminals have characteristics of the same amplitude and opposite phase within the pass band and of the same amplitude and phase outside the pass band.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An elastic surface acoustic wave filter apparatus comprising:

a first set of cascaded elastic surface acoustic wave filters including a first elastic surface acoustic wave filter having a predetermined value of an input/output phase characteristic within a pass band of said elastic surface acoustic wave filter apparatus and a second elastic surface acoustic wave filter being electrically connected to the first elastic surface acoustic wave filter in a cascade arrangement and having an input/output phase characteristic that is different by about 180 degrees from said predetermined value of the input/output phase characteristic of the first elastic surface acoustic wave filter within the pass band of said elastic surface acoustic wave filter apparatus; and a second set of cascaded elastic surface acoustic wave filters including a third elastic surface acoustic wave filter having said predetermined value of input/output phase characteristic within a pass band of said elastic surface acoustic wave filter apparatus and a fourth elastic surface acoustic wave filter being electrically connected to the third elastic surface acoustic wave filter in a cascade arrangement and having the predetermined value of input/output phase characteristic within the pass band of said elastic surface acoustic wave filter apparatus, each of the first and second sets of cascaded elastic surface acoustic wave filters including input terminals and output terminals; wherein one of the input and output terminals of said first set of cascaded elastic surface acoustic wave filters and one of the input and output terminals of said second set of cascaded elastic surface acoustic wave filters being electrically connected in parallel to define an unbalanced input/output terminal, the other of the input and output terminals of said first set of cascaded elastic surface acoustic wave filters and the other of the input and output terminals of said second set of cascaded elastic surface acoustic wave filters being electrically connected in series to define balanced input/output terminals.

2. The elastic surface acoustic wave filter apparatus according to claim 1, wherein the balanced input/output terminals located where said first set of cascaded elastic surface acoustic wave filters and said second set of cascaded elastic surface acoustic wave filters are connected in series to each other define output terminals, and a serially connected junction of said output terminals defines a ground terminal.

3. The elastic surface acoustic wave filter apparatus according to claim 1, wherein one of the first and second elastic surface acoustic wave filters of said first set of cascaded elastic surface acoustic wave filters having the input/output phase characteristic that is different by about 180 degrees from said predetermined value of the input/output phase characteristic within said pass band, has an output IDT arranged in an opposite orientation relative to an input IDT of the other of the first and second elastic surface acoustic wave filters of said first set of cascaded elastic surface acoustic wave filters which has said predetermined value of input/output phase characteristic within said pass band, and the one of the first and second elastic surface acoustic wave filters of said first set of cascaded elastic surface acoustic wave filters having an input IDT arranged in the same orientation as an output IDT of the other of the first and second elastic surface acoustic wave filters of said first set of cascaded elastic surface acoustic wave filters which has said predetermined value of input/output phase characteristic within said pass band.

4. The elastic surface acoustic wave filter apparatus according to claim 3, wherein a number of electrode fingers of common electrodes connected to the balanced input/output terminals of the first and second elastic surface acoustic wave filters of said first set of cascaded elastic surface acoustic wave filters are respectively equal to a number of electrode fingers of common electrodes connected to the balanced input/output terminals of the third and fourth elastic surface acoustic wave filters of said second set of cascaded elastic surface acoustic wave filters.

5. The elastic surface acoustic wave filter apparatus according to claim 3, wherein the first and second elastic surface acoustic wave filters of said first set of cascaded elastic surface acoustic wave filters and the third and fourth elastic surface acoustic wave filters of said second set of cascaded elastic surface acoustic wave filters are each constituted by IDTs comprising input or output electrode fingers which are even in number.

6. The elastic surface acoustic wave filter apparatus according to claim 1, wherein one of the first and second elastic surface acoustic wave filters of said first set of cascaded elastic surface acoustic wave filters which has an input/output phase characteristics that is different by about 180 degrees from said predetermined value of the input/output phase characteristic within said pass band, has an output IDT arranged in the same orientation as an input IDT of the other of the elastic surface acoustic wave filters of said first set of cascaded elastic surface acoustic wave filters which has said predetermined value of the input/output phase characteristic within said pass band, and has an input IDT arranged in an opposite orientation relative to an output IDT of the other of the first and second elastic surface acoustic wave filters of said first set of cascaded elastic surface acoustic wave filters which has said predetermined value of input/output phase characteristic within said pass band.

7. The elastic surface acoustic wave filter apparatus according to claim 1, wherein one of the first and second elastic surface acoustic wave filters of said first set of cascaded elastic surface acoustic wave filters which has an input/output phase characteristic that is different by about 180 degrees from said predetermined value of the input/output phase characteristic within said pass band, has a spacing between an electrode finger of an input IDT and an electrode finger of an output IDT that is different by a multiple of any integer plus about 0.5 wavelength from the spacing between an electrode finger of an input IDT and an electrode finger of an output IDT of the other elastic surface acoustic wave filter which has said predetermined value of input/output phase characteristic within said pass band.

8. The elastic surface acoustic wave filter apparatus according to claim 1, wherein the input terminal and the output terminal of each of said first set of cascaded elastic surface acoustic wave filters and said second set of cascaded elastic surface acoustic wave filters includes a pair of terminals, respectively.

9. The elastic surface acoustic wave filter apparatus according to claim 8, wherein one of the terminals of said one of the input and output terminals of said first set of cascaded elastic surface acoustic wave filters and one of the terminals of said one of the input and output terminals of said second set of cascaded elastic surface acoustic wave filters are electrically connected to define the unbalanced input/output terminal and the other terminal of said one of the input and output terminals of said first set of cascaded elastic surface acoustic wave filters and the other terminal of said one of the input and output terminals of said second set of cascaded elastic surface acoustic wave filters define ground terminals, respectively.

* * * * *